United States Patent
Tsai et al.

(10) Patent No.: US 8,350,575 B2
(45) Date of Patent: Jan. 8, 2013

(54) ELECTRICAL CONNECTION DEFECT DETECTION SYSTEM AND METHOD

(75) Inventors: Su-Wei Tsai, Taipei (TW);
Shang-Tsang Yeh, Jhonghe (TW)

(73) Assignee: Test Research, Inc., Taipei (TW)

( * ) Notice: Subject to any disclaimer, the term of this patent is extended or adjusted under 35 U.S.C. 154(b) by 487 days.

(21) Appl. No.: 12/761,456

(22) Filed: Apr. 16, 2010

(65) Prior Publication Data

US 2011/0156717 A1 Jun. 30, 2011

(30) Foreign Application Priority Data

Dec. 31, 2009 (TW) .............................. 98146546 A

(51) Int. Cl.
*G01R 31/04* (2006.01)

(52) U.S. Cl. ........ 324/538; 324/658; 324/691; 324/509; 324/754.01; 324/754.27; 324/754.28; 324/763.01; 324/763.02

(58) Field of Classification Search .................. 324/538, 324/658, 691, 509, 754.01, 754.27, 754.28, 324/763.01, 763.02

See application file for complete search history.

(56) References Cited

U.S. PATENT DOCUMENTS

| | | | | | |
|---|---|---|---|---|---|
| 4,322,682 A | * | 3/1982 | Schadwill | ................. | 324/750.25 |
| 4,714,875 A | * | 12/1987 | Bailey et al. | ................. | 324/73.1 |
| 5,124,660 A | * | 6/1992 | Cilingiroglu | ................. | 324/538 |
| 5,202,640 A | * | 4/1993 | Schaaf et al. | ................. | 324/537 |
| 5,254,953 A | * | 10/1993 | Crook et al. | ................. | 324/538 |
| 5,365,179 A | * | 11/1994 | Rogers | ................. | 324/650 |
| 5,498,964 A | * | 3/1996 | Kerschner et al. | ................. | 324/530 |
| 5,557,209 A | * | 9/1996 | Crook et al. | ................. | 324/537 |
| 5,625,292 A | * | 4/1997 | Crook et al. | ................. | 324/538 |
| 5,708,369 A | * | 1/1998 | Horn | ................. | 324/688 |
| 5,867,020 A | * | 2/1999 | Moore et al. | ................. | 324/95 |
| 6,310,482 B1 | * | 10/2001 | Hong | ................. | 324/681 |
| 7,702,982 B2 | * | 4/2010 | Chen et al. | ................. | 714/727 |
| 8,179,143 B2 | * | 5/2012 | Yeh et al. | ................. | 324/522 |
| 2003/0117129 A1 | * | 6/2003 | Parrish | ................. | 324/158.1 |
| 2005/0207131 A1 | * | 9/2005 | Prokofiev et al. | ................. | 361/760 |
| 2006/0034032 A1 | * | 2/2006 | White et al. | ................. | 361/234 |
| 2008/0123273 A1 | * | 5/2008 | Meier et al. | ................. | 361/683 |
| 2011/0156718 A1 | * | 6/2011 | Tsai et al. | ................. | 324/538 |

* cited by examiner

*Primary Examiner* — Patrick Assouad
*Assistant Examiner* — Lamarr Brown
(74) *Attorney, Agent, or Firm* — Muncy, Geissler, Olds & Lowe, PLLC

(57) ABSTRACT

An electrical connection defect detection system to detect whether an electrical connection between an under-test pin of an under-test device and a signal line of a circuit board is normal is provided. The electrical connection defect detection system comprises a signal provider providing a test signal to the under-test pin through the signal line, a detection module, an electrode board and a plurality of grounding paths. The electrode board comprises a detection surface to be adapted to a surface of the under-test device opposite to the under-test pin to make the detection module detect a capacitance value associated with the electrode board, the under-test pin and the signal line larger than a threshold value when their connection is normal. The grounding paths are connected to one of not-under-test pin groups respectively to further connect to the ground potential. An electrical connection defect detection method is disclosed herein as well.

12 Claims, 3 Drawing Sheets

1

2

ELECTRICAL CONNECTION DEFECT DETECTION SYSTEM AND METHOD

RELATED APPLICATIONS

This application claims priority to Taiwan Application Serial Number 98146546, filed Dec. 31, 2009, which is herein incorporated by reference.

BACKGROUND

1. Technical Field

The present disclosure relates to a detection system and a detection method. More particularly, the present disclosure relates to an electrical connection defect detection system and an electrical connection defect detection method.

2. Description of Related Art

Modern technology, especially the use of electronic devices, brings convenience to our daily life. Often, the electronic devices include many different chips or connectors formed thereon to deal with or transmit different types of data. The pins of the chips and the connectors are connected to the signal lines of the circuit boards of the electronic devices to perform data exchange at the request of the user.

However, the electrical connection of the pins and the signal lines may not be properly connected due to the unsuccessful welding process. When the pins and the signal lines are not properly connected to each other, the electronic device may fail to perform normal operation. Therefore, an electrical connection defect detection system is needed to detect whether there is a defect between the pins and the corresponding signal lines. Usually, a probe is used to contact a signal line corresponding to an under-test pin of an under-test object and to further send a test signal to the under-test pin through the signal line. An electrode board connected to a detection module is placed on a surface of the under-test object to determine whether a capacitance associated with the electrode board and the under-test pin is detected. The other pins not under test have to be connected to the ground potential to avoid undesired effect.

Please refer to FIG. 1. FIG. 1 is a side view of an under-test system 1 of a conventional design. The under-test system 1 comprises an under-test chip 10, a circuit board 12 and a grounding plane 14. The electrical connection defect detection system (not shown) described above can detect whether the electrical connection between the pins (depicted as a plurality of semicircle shaped objects placed under the under-test chip 10 FIG. 1) of the under-test chip 10 and is the signal line 120 of the circuit board 12 is normal or not. The grounding plane 14 provides a common grounding path for all the pins not under test during the test procedure to avoid the undesired effect.

Nevertheless, the number of pins on the chip increases a lot in modern technology. The equivalent capacitor and the equivalent resistance of the common grounding path for such a large number of pins may become very large. For instance, if the equivalent resistor of the grounding plane 14 is close to the resistor R1 between the signal line 120 and the power supply Vcc, the equivalent capacitor thus generated will be coupled to the capacitance associated with the electrode board and the test pin. Therefore, the test result will be inaccurate due to the equivalent capacitance generated by the common grounding path. Further, when the test signal is coupled to the power pins (labeled as Vcc in FIG. 1) of the under-test chip through the power supply Vcc, the capacitance generated according to the power pins will affect the test result as well.

Accordingly, what is needed is an electrical connection defect detection system and method to avoid the generation of the undesired capacitances. The present disclosure addresses such a need.

SUMMARY

An aspect of the present disclosure is to provide an electrical connection defect detection system to detect whether an electrical connection between an under-test pin of an under-test device and a signal line of a circuit board is normal, wherein the electrical connection defect detection system comprises a signal provider, a detection module, an electrode board and a plurality of grounding paths. The signal provider provides a test signal to the under-test pin through the signal line. The electrode board is electrically connected to the detection module, wherein the electrode board comprises a detection surface to contact a surface of the under-test device and keep a distance from the under-test pin such that the detection module detects a value of a capacitance associated with the electrode board, the under-test pin and the signal line larger than a threshold value when the signal provider provides the test signal to the under-test pin and when the connection of the under-test pin and the signal line is normal. The plurality of grounding paths each corresponding to one of a plurality of not-under-test pin groups of the under-test device to make the plurality of groups of not-under-test pins connect to the ground potential.

Another aspect of the present disclosure is to provide an electrical connection defect detection method to detect whether an electrical connection between an under-test pin of an under-test device and a signal line of a circuit board is normal, wherein the electrical connection defect detection method comprises the steps as follow. A plurality of not-under-test pins of the under-test device are separated into a plurality of not-under-test pin groups. The not-under-test pin groups are connected to a ground potential through a corresponding grounding path respectively. The test signal is provided to the under-test pin through the signal line. The detection surface of an electrode board is contacted to a surface of the under-test device opposite to the under-test pin to keep a distance between the electrode board and the under-test pin. A value of a capacitance associated with the electrode board, the under-test pin and the signal line is detected to be larger than a threshold value when the connection of the under-test pin and the signal line is normal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

DETAILED DESCRIPTION is Reference will now be made in detail to the present embodiments of the invention, examples of which are illustrated in the accompanying drawings. Wherever possible, the same reference numbers are used in the drawings and the description to refer to the same or like parts.

Please refer to FIG. 2. FIG. 2 is a side view of an electrical connection defect detection system 2 of an embodiment of the present disclosure. The electrical connection defect detection system 2 is for detecting whether an electrical connection between an under-test pin of an under-test device 20 and signal lines 220 of a circuit board 22 is normal. The under-test device 20 in the present embodiment can be a chip or a connector on the circuit board 22, wherein the under-test device 20 is connected to the signal lines 220 of the circuit board 22 through a plurality of pins (depicted as a plurality of semicircle shaped objects placed between the under-test device 20 and the circuit board 22 in FIG. 2).

Figure 1:
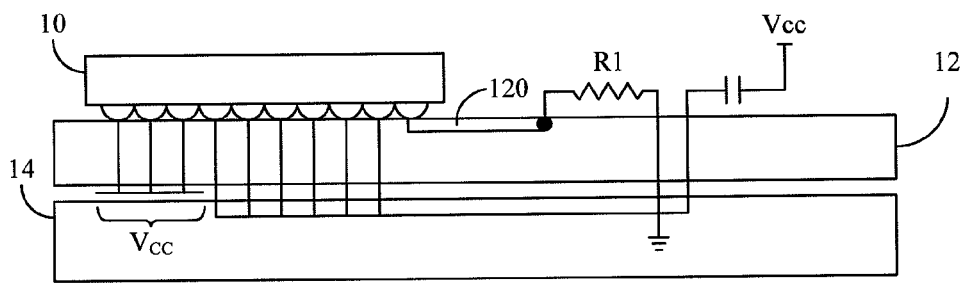
FIG. 1 is a side view of an under-test system of a conventional design.

A welding process is performed on the pins and the signal lines to make the under-test device 20 and the circuit board 22 electrically connected. However, the electrical connection of the pins and the signal lines may not be properly connected due to the unsuccessful welding process. Therefore, an electrical connection defect detection system is needed to detect whether there is a connection defect between the pins and the corresponding signal lines.

The electrical connection defect detection system 2 of the present embodiment comprises a signal provider, a detection module 24 and an electrode board 26. The signal provider substantially comprises a probe 280 and a signal source 282. The signal source 282 provides a test signal 281. After the probe 280 contacts the signal line 220, the signal source 282 transmits the test signal 281 through the signal line 220 to the corresponding under-test pin. During the test procedure, the pins not under test are all grounded to avoid undesirable effects.

The electrode board 26 is electrically connected to the detection module 24. In an embodiment, the electrode board 26 comprises an amplifier 260 and positive/negative test ends 262. A detection surface of the electrode board 26 directly contacts a surface 200 of the under-test device 20 opposite to the surface where the pins are placed. Therefore, the detection surface of the electrode board 26 keeps a distance from the under-test pin. In an embodiment, the positive/negative test ends 262 provide a supply voltage and a ground potential (not shown) to the electrode board 26 through the positive end and the negative end respectively. Generally speaking, the supply voltage is transmitted to the amplifier 260. The ground potential is transmitted to the surface opposite to the detection surface. However, in other embodiments, other possible arrangements can be made depending on different conditions.

The electrode board 26 is able to detect a capacitance related to the under-test pin, the circuit board 22 and the electrode board 26 when the electrical connection between the signal line and the corresponding under-test pin is normal. The electrode board 26 is also able to detect a current and a voltage associated with the capacitance described above. The capacitance is generated because of the test signal 281 sent from the probe 280 to the under-test pin and is detected by the positive/negative test end 262. After the detection of the positive/negative test end 262, a signal associated with the capacitance is amplified by the amplifier 260 and is sent to the detection module 24. The detection module 24 is able to determine whether the value of the capacitance is larger than a threshold value. When the value of the capacitance is larger than the threshold value, the detection module 24 determines that the electrical connection is normal. On the other hand, when the electrical connection is abnormal, the test signal 281 fails to be transmitted from the signal line to the corresponding under-test pin. When the electrical connection is abnormal, the capacitance generated between the under-test device 20 and the electrode board 26 is about the same as the capacitance when the electrical connection is normal, however, the capacitance between the circuit board 22 and the electrode board 26 decreases a lot due to the abnormal connection between the signal lines and the under-test pin. As a result, the detection module 24 determines that the total capacitance is below the threshold value. The current and the voltage associated with the capacitance decrease as well. Therefore, the defect detection mechanism can be made.

Figure 2:
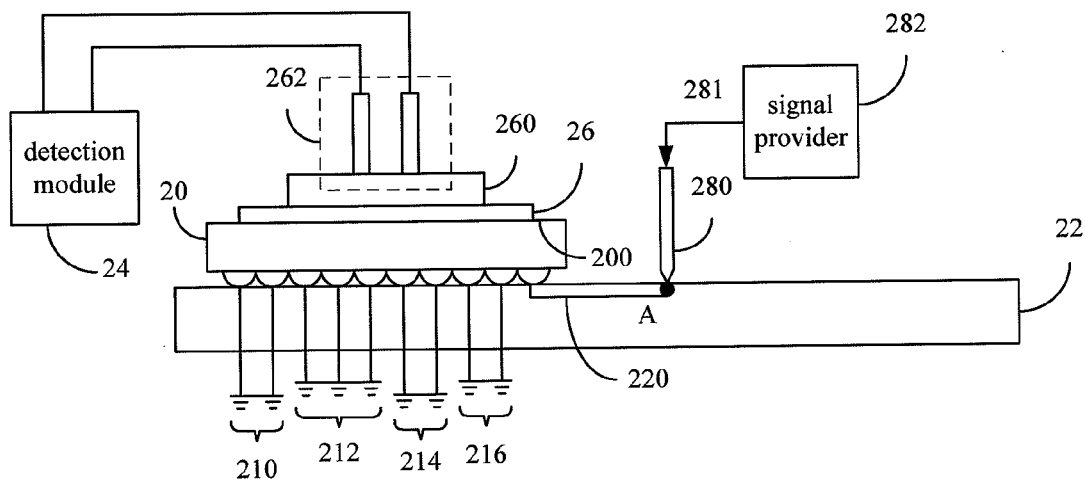
FIG. 2 is a side view of an electrical connection defect detection system of an embodiment of the present disclosure.

In FIG. 2, the probe 280 contacts the signal line 220. Therefore, the pin connected to the line 220 is the under-test pin, while the other pins are not-under-test pins. The not-under-test pins are separated into a plurality of not-under-test pin groups each corresponding to a grounding path 210, 212, 214 and 216. The not-under-test pins of each not-under-test pin group are connected to the ground potential through the corresponding grounding path.

Figure 3A:
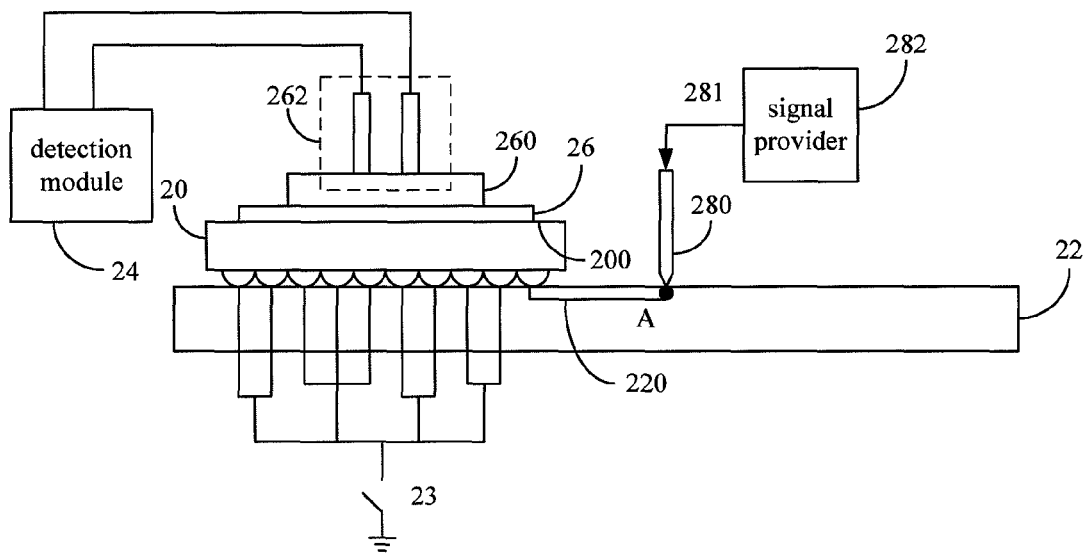
FIG. 3A is a side view of the electrical connection defect detection system when the grounding paths are connected in parallel and further connected to a ground switch of an embodiment of the present disclosure.

In an embodiment, the grounding paths 210, 212, 214 and 216 depicted in FIG. 2 are connected in parallel as depicted in FIG. 3A, and are further connected to a ground switch 23, wherein the plurality of grounding paths 210, 212, 214 and 216 are connected to the ground potential when the ground switch 23 is close. It's noticed that in order to make the diagram clear, the grounding paths 210, 212, 214 and 216 are not labeled in FIG. 3A. Therefore, the equivalent resistance of the parallel-connected grounding paths 210, 212, 214 and 216 does not increase but decreases instead. Consequently, the detection result of the electrode board 26 is no longer affected by the common grounding path. It's noticed that, the number of the grounding paths and the number of the corresponding not-under-test pin groups can be different in other embodiments.

Figure 3B:
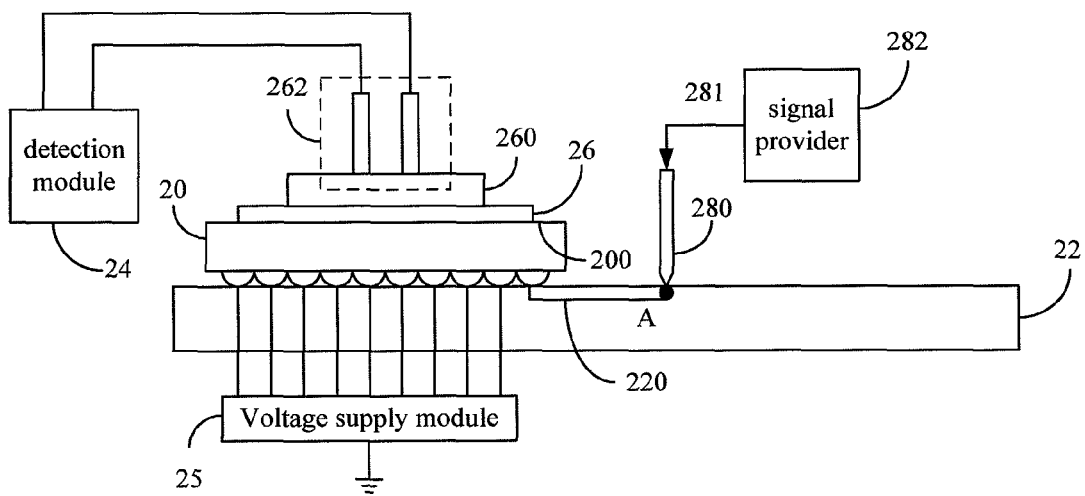
FIG. 3B is a side view of the electrical connection defect detection system when the grounding paths are connected in parallel and further connected to a power supply respectively of an embodiment of the present disclosure.

In another embodiment, as depicted in FIG. 3B, the electrical connection defect detection system 2 further comprises a voltage supply module 25. Generally, the voltage supply module 25 is used only during the test procedure that takes power to operate. The voltage supply module 25 is able to provide the power to the power pins and provide the ground potential to the ground pins. In the present embodiment, each not-under-test pin groups comprises only one not-under-test pin. Thus, each connection between a not-under-test pin and the power supply module 25 is treated as a grounding path. Thus, the power supply module 25 provides the ground potential directly to each not-under-test pin to make each not-under-test pin connected to the ground potential respectively. The condition of only one common grounding path is thus avoided.

Figure 4:
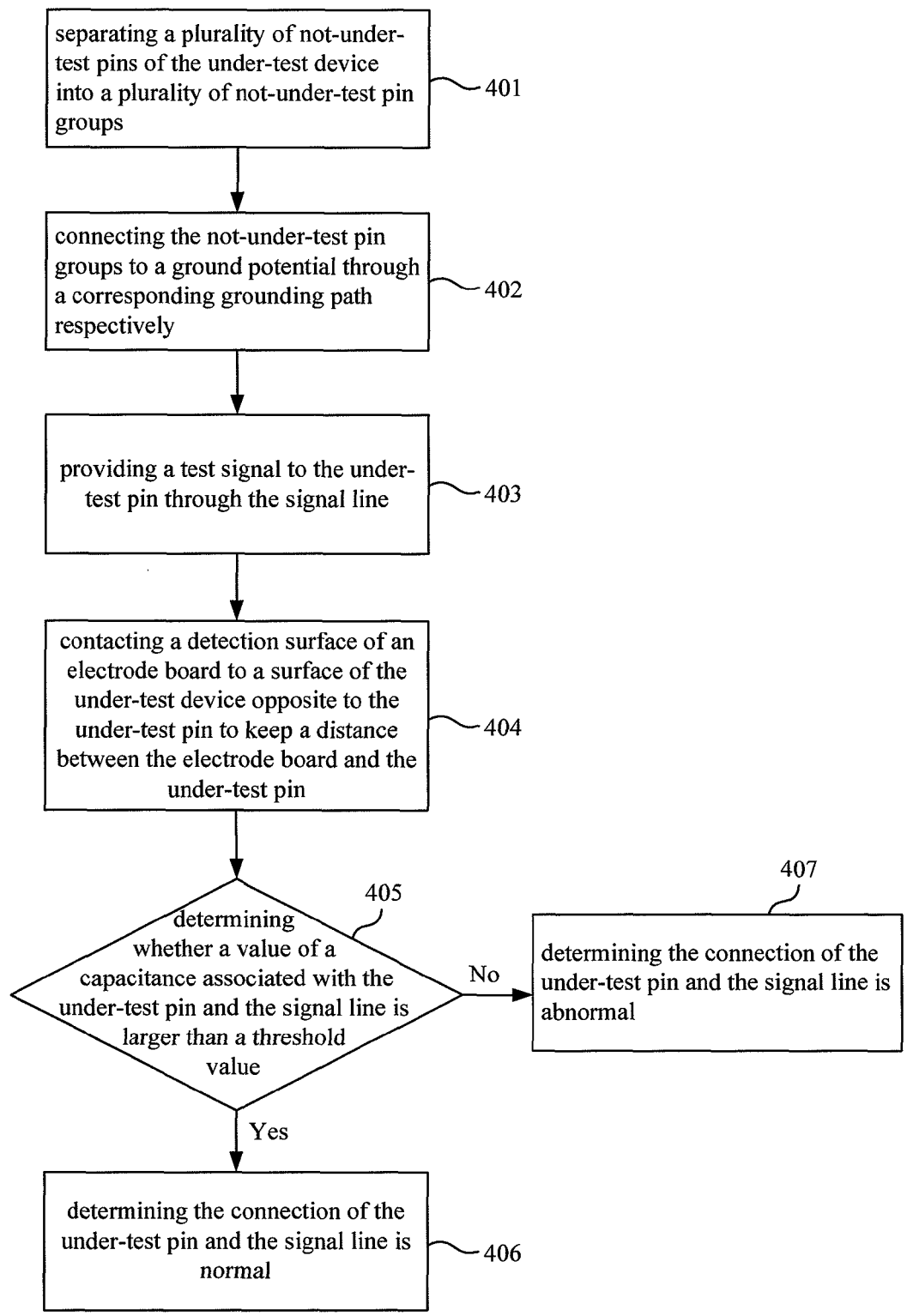
FIG. 4 is a flow chart of an electrical connection defect detection method of yet another embodiment of the present disclosure.

Please refer to FIG. 4. FIG. 4 is a flow chart of an electrical connection defect detection method of yet another embodiment of the present disclosure. The electrical connection defect detection method is adapted to the electrical connection defect detection system 2 depicted in FIG. 2 to detect whether an electrical connection between an under-test pin of an under-test device and a signal line of a circuit board is normal. The electrical connection defect detection method comprises the steps as follows. In step 401, a plurality of not-under-test pins of the under-test device 20 are separated into a plurality of not-under-test pin groups. In step 402, the not-under-test pin groups are connected to a ground potential through a corresponding grounding path 210, 212, 214 and 216 respectively. In step 403, the test signal 281 is provided to the under-test pin through the signal line 220. In step 404, the detection surface of an electrode board 26 is contacted to a surface 200 of the under-test device 20 opposite to the under-test pin to keep a distance between the electrode board 26 and the under-test pin. In step 405, the detection module 24 determines whether the value of a capacitance associated with the electrode board, the under-test pin and the signal line 220 is larger than a threshold value. When the value of the capacitance is larger than the threshold value, the step 406 is performed to determine the connection of the under-test pin and the signal line is normal. When the value of the capacitance is smaller than the threshold value, the step 407 is performed to determine the connection of the under-test pin and the signal line is abnormal.

Table 1 shows a comparison of the capacitances under the conditions of normal and abnormal connection between the under-test pin and the signal line when a common grounding path is used or when a multiple of grounding paths are used. $C_{LK}$ stands for the equivalent capacitance of the grounding plane. $C_{DUT}$ stands for the capacitance associated with the electrode board and the under-test pin. $C_{DUT}+C_{LK}$ stands for the value of the total capacitance detected by the detection module 24.

TABLE 1

| | CDUT + CLK (Normal) | CLK (Abnormal) | Difference | Detection result |
|---|---|---|---|---|
| Common grounding path | 408fF | 320fF | −22.6% | Pass |
| Multiple grounding path | 125fF | 40fF | −68% | Fail |

In the present embodiment, a difference of −40% from a standard value is set to be the threshold. Under the circumstance that there is no equivalent capacitance generated, if the under-test pin and the signal line are not properly connected, the electrode board 26 will only sense a small amount of value of the capacitance between the under-test pin and the signal line, therefore the under-test pin can't pass the test. However, according to Table 1, an equivalent resistance is generated when only a common grounding path is used. Consequently, the equivalent capacitance generated from the equivalent resistance and the capacitance generated by the coupling effect from the power supply together make the value of the capacitance detected by the electrode board 26 become much higher when the under-test pin and the signal line are not connected properly. The value of the capacitance falls on −22.6% of the standard value and passes the test.

On the contrary, the value of the capacitance detected by the electrode board 26 when the multiple grounding paths adapted in the present disclosure is used falls on −68% of the standard value, which is smaller than −40% of the standard value. Therefore, the value of the capacitance detected can't pass the test. The abnormal connection between the under-test pin and the signal line is successfully detected.

According to the above embodiments and the statistics, the electrical connection defect detection system of the present disclosure is able to prevent the occurrence of the equivalent capacitance by separating the not-under-test pins into a plurality of groups, wherein each not-under-test pin group has it's own grounding path. Therefore, the effect of the equivalent resistance or the equivalent capacitance can be greatly reduced.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. An electrical connection defect detection system to detect whether an electrical connection between an under-test pin of an under-test device and a signal line of a circuit board is normal, wherein the electrical connection defect detection system comprises:
a signal provider to provide a test signal to the under-test pin through the signal line;
a detection module;
an electrode board electrically connected to the detection module, wherein the electrode board comprises:
a detection surface to contact a surface of the under-test device and keep a distance from the under-test pin such that the detection module detects a value of a capacitance associated with the electrode board, the under-test pin and the signal line larger than a threshold value when the signal provider provides the test signal to the under-test pin and when the connection of the under-test pin and the signal line is normal; and
a plurality of grounding paths each corresponding to one of a plurality of not-under-test pin groups of the under-test device to make the plurality of groups of not-under-test pins connect to the ground potential.

2. The electrical connection defect detection system of claim 1, wherein the plurality of grounding paths are further connected to a ground switch, wherein the plurality of grounding paths are connected to the ground potential when the ground switch is close.

3. The electrical connection defect detection system of claim 1, further comprising a voltage supply module, whereas each of the not-under-test pin group further comprises a not-under-test pin, the voltage supply module directly provides the ground potential to each of the not-under-test pin through the corresponding grounding path.

4. The electrical connection defect detection system of claim 1, wherein the signal provider comprises a probe and a signal source, wherein the probe contacts the signal line to make the signal source provide the test signal to the under-test pin.

5. The electrical connection defect detection system of claim 1, when the signal provider provides the test signal to the under-test pin and when the connection of the under-test pin and the signal line is abnormal, the detection module detects the value of the capacitance smaller than the threshold value.

6. The electrical connection defect detection system of claim 1, the detection module further detects a current generated by the capacitance.

7. The electrical connection defect detection system of claim 1, the detection module further detects a voltage generated by the capacitance.

8. An electrical connection defect detection method to detect whether an electrical connection between an under-test pin of an under-test device and a signal line of a circuit board is normal, wherein the electrical connection defect detection method comprises the steps of:

separating a plurality of not-under-test pins of the under-test device into a plurality of not-under-test pin groups;

connecting the not-under-test pin groups to a ground potential through a corresponding grounding path respectively;

providing a test signal to the under-test pin through the signal line;

contacting a detection surface of an electrode board to a surface of the under-test device opposite to the under-test pin to keep a distance between the electrode board and the under-test pin; and detecting a value of a capacitance associated with the electrode board, the under-test pin and the signal line larger than a threshold value when the connection of the under-test pin and the signal line is normal.

9. The electrical connection defect detection method of claim 8, wherein the plurality of grounding paths are further connected to a ground switch, wherein the plurality of grounding paths are connected to the ground potential when the ground switch is close.

10. The electrical connection defect detection method of claim 8, wherein each of the not-under-test pin group further comprises a not-under-test pin, each of the grounding path is connected to a voltage supply module, wherein the voltage supply module directly provides the ground potential to each of the not-under-test pin through the corresponding grounding path.

11. The electrical connection defect detection method of claim 8, wherein the test signal is provided to the under-test pin through a probe of a signal provider.

12. The electrical connection defect detection method of claim 8, when the connection of the under-test pin and the signal line is abnormal, the detected value of the capacitance is smaller than the threshold value.

* * * * *